United States Patent
Chen et al.

(10) Patent No.: US 10,042,567 B2
(45) Date of Patent: Aug. 7, 2018

(54) STORAGE DEVICE AND DATA STORING METHOD THEREOF

(71) Applicant: Silicon Motion, Inc., Jhubei, Hsinchu (TW)

(72) Inventors: Ching-Ke Chen, Taichung (TW); Yu-Chi Lai, New Taipei (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/255,155

(22) Filed: Sep. 2, 2016

(65) Prior Publication Data

US 2017/0308311 A1    Oct. 26, 2017

(30) Foreign Application Priority Data

Apr. 21, 2016    (TW) .............................. 105112504 A

(51) Int. Cl.
*G11C 11/34* (2006.01)
*G06F 3/06* (2006.01)
(Continued)

(52) U.S. Cl.
CPC ............ *G06F 3/0619* (2013.01); *G06F 3/065* (2013.01); *G06F 3/068* (2013.01); *G06F 3/0656* (2013.01); *G11C 11/56* (2013.01); *G11C 11/5642* (2013.01); *G11C 16/26* (2013.01); *G11C 16/349* (2013.01); *G11C 2207/2236* (2013.01); *G11C 2211/5641* (2013.01)

(58) Field of Classification Search
None
See application file for complete search history.

(56) References Cited

U.S. PATENT DOCUMENTS

2009/0216936 A1* 8/2009 Chu ................... G06F 12/0246
711/103
2011/0010488 A1* 1/2011 Aszmann ............. G06F 3/0608
711/103
(Continued)

FOREIGN PATENT DOCUMENTS

CN    104572478    4/2015
TW    201305817    2/2013
(Continued)

OTHER PUBLICATIONS

Office Action issued by Taiwan Intellectual Property Office dated Jun. 19, 2017.

*Primary Examiner* — Uyen B Tran
(74) *Attorney, Agent, or Firm* — Chieh-Mei Wang

(57) ABSTRACT

A storage device and a data storing method thereof are provided. The storage device includes a data storage medium and the control unit. The data storage medium includes a data storage area with a plurality of first type of data blocks. When a data reading operation is executed on a current data block of the data storage medium, the control unit determines whether a read count of the current data block is greater than a first threshold, determines whether the current data block is one of the first type of data blocks and generate a determination result according to the result, the control unit selects a plurality of first type of data blocks and switches the selected data blocks to a fast mode. Finally, the control unit moves data stored in the current data block to the selected data blocks under fast mode.

17 Claims, 2 Drawing Sheets

(51) Int. Cl.
*G11C 11/56* (2006.01)
*G11C 16/26* (2006.01)
*G11C 16/34* (2006.01)

(56) References Cited

U.S. PATENT DOCUMENTS

| | | | | |
|---|---|---|---|---|
| 2012/0239990 | A1* | 9/2012 | Mataya | G06F 12/0866 714/704 |
| 2013/0138871 | A1* | 5/2013 | Chiu | G06F 12/0246 711/103 |
| 2015/0193302 | A1* | 7/2015 | Hyun | G11C 29/52 714/764 |
| 2016/0335178 | A1* | 11/2016 | Patel | G06F 12/0246 |

FOREIGN PATENT DOCUMENTS

| | | |
|---|---|---|
| TW | 201435726 | 9/2014 |
| TW | 201533656 | 9/2015 |

* cited by examiner

STORAGE DEVICE AND DATA STORING METHOD THEREOF

FIELD OF THE INVENTION

The present invention relates to a data storing technology, and more particularly to a storage device and a data storing method for the storage device.

BACKGROUND OF THE INVENTION

In general, a storage device is mainly constituted of a control unit and a data storage medium (for example, a flash memory). The data storage medium has a plurality of data blocks. The control unit is electrically coupled to the data storage medium and for executing data program/erase operation on the data blocks.

Because of its enhanced data storage capacity, triple-level cell (TLC) type flash memory has been widely used in solid state drives (SSDs). However, when the control unit frequently accesses frequently-used data, the slow data access speed is often a bottleneck of affecting the overall performance of the solid state drives.

SUMMARY OF THE INVENTION

One objective of the present invention is to provide a storage device capable of improving data access speed of frequently-used data.

Another objective of the present invention is to provide a data storing method for a storage device, so that a control unit of the storage device is capable of improving data access speed of frequently-used data.

The present invention provides a storage device, which includes a data storage medium and a control unit. The data storage medium includes a data storage area. The data storage area includes a plurality of first type of data blocks, each of the first type of data blocks includes a plurality of first storage units, and each of the first storage units is configured to store M-bit data and M is an integer. The control unit is electrically coupled to the data storage medium. When a data reading operation is executed on a current data block of the data storage medium, the control unit is configured to determine whether a read count of the current data block is greater than a first threshold, determine whether the current data block is the first type of data block, and generate a determination result accordingly. According to the determination result, the control unit is further configured to select a plurality of first type of data blocks in the data storage area, switch the selected first type of data blocks to a first mode, and move data stored in the current data block to the selected first type of data blocks under the different mode. Each of the first type of data blocks has a higher storage capacity than each of the selected first type of data blocks under the first mode.

The present invention further provides a data storing method for a storage device. The data storing method includes steps of: performing a data reading operation on a current data block; determining whether a read count of the current data block is greater than a first threshold; and if yes, selecting and switching a plurality of first type of data blocks in a fast mode, wherein the data blocks have a lower data storage capacity are configured to operate faster in the fast mode.

The present invention further provides a method of data management, which includes steps of: defining a data storage area and a data buffer area, wherein the data storage area comprises a plurality of first type of data blocks; performing a data reading operation on a current data block, wherein the current data block is one of the first type of data blocks; determining whether a read count of the current data block is greater than a first threshold; and selecting and switching more than one of the first type of data blocks to a fast mode, wherein the more than one of the first type of data blocks have a lower data storage capacity under the fast mode than the first type of data blocks not under fast mode.

In summary, when the data reading operation is executed on the current data block, the control unit of the storage device of the present invention first determines whether the read count of the current data block is greater than the first determined count and whether the current data block is the first type of data block. If both of the aforementioned determination results are true, the control unit switches the plurality of first type of data blocks (e.g., TLC data blocks) to the plurality of second type of data blocks (e.g., SLC data blocks) having lower data storage capacity but higher data access speed, and moves the data in the current data block to the second data blocks. As a result, the storage device of the present invention has a higher data access speed for frequently-used data.

BRIEF DESCRIPTION OF THE DRAWINGS

Other advantages, objectives and features of the present invention will become apparent from the following description referring to the attached drawings.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
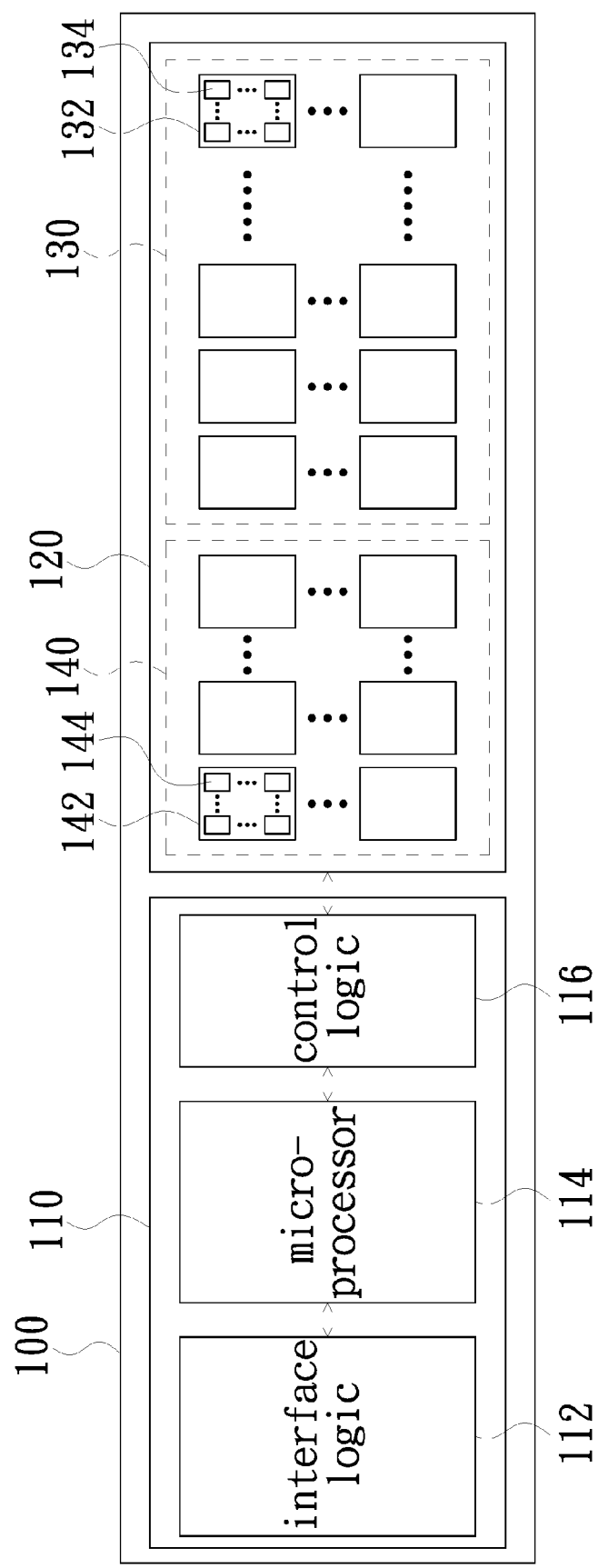
FIG. 1 is a schematic block view of a storage device in accordance with an embodiment of the present invention.

FIG. 1 is a schematic block view of a storage device in accordance with an embodiment of the present invention. As shown, the storage device 100 of the present embodiment mainly includes a control unit 110 and a data storage medium 120. In the present embodiment, the data storage medium 120 is implemented by a non-volatile memory, such as flash memory, MRAM (Magnetic RAM), FRAM (Ferroelectric RAM), PCM (Phase Change Memory), STTRAM (Spin-Transfer Torque RAM), ReRAM (Resistive RAM) and Memristor, etc. Hereunder the data storage medium 120 being as a flash memory is taken as an example to illustrate the present invention.

As shown in FIG. 1, the data storage medium 120 includes a data storage area 130 and a data buffer area 140. The data storage area 130 includes a plurality of first type of data blocks 132. Each one of the first type of data blocks 132 includes a plurality of first storage units 134. Each one of the first storage units 134 can store M-bit data. The data buffer area 140 includes a plurality of second type of data blocks 142. Each one of the second type of data blocks 142 includes a plurality of second storage units 144. Each one of the second storage units 144 can store N-bit data. In the present embodiment, the aforementioned M and N are natural numbers, and N is less than M.

In one embodiment, the first type of data block 132 may be a triple-level cell (TLC) data block which means that each first storage unit 134 can store 3-bit data. And correspondingly, the second type of data block 142 may be a multi-level cell (MLC) data block which means that each second storage unit 144 can store 2-bit data; or, the second type of data block 142 may be a single-level cell (SLC) data block which means that each second storage unit 144 can store 1-bit data.

In another embodiment, the first type of data block 132 may be a MLC data block which means that each first storage unit 134 can store 2-bit data. And correspondingly, the second type of data block 142 may be a SLC data block which means that each second storage unit 144 can store 1-bit data.

Further, the first type of data block 132 and the second type of data block 142 may be the same type of data block but work in different modes; for example, both are TLC data blocks or both are MLC data blocks. The second type of data block 142 is switched from normal mode (e.g., TLC) to fast mode (e.g., SLC). However, due to the physical limitation, it is understood that the second type of data block 142 (TLC data block in SLC mode) may not have a performance same as a native SLC data block.

In theory, the data storage capacity of one TLC data block is three times of that of one SLC data block. Therefore, once a TLC data block is switched from a TLC mode to a SLC mode, the data storage capacity in this mode is only one-third of its initial configuration. In other words, three TLC data block in SLC mode can provide the same data storage capacity of one TLC data block. However, the TLC data block in SLC mode provides some advantages such as higher data access speed.

To simplify the description of the present invention, hereunder the present embodiment of the invention is based on a configuration of: all of the first type of data blocks 132 are TLC data blocks and configured for storing data; and all of the second type of data blocks 142 are SLC data blocks and functioned as data buffers due to the feature of high data access speed.

Please continue to refer to FIG. 1. As shown, the control unit 110 is electrically coupled to the data storage medium 120 and configured to control an operation (e.g., data access or erase) of the data storage medium 120. In the present embodiment, the control unit 110 includes an interface logic 112, a microprocessor 114 and a control logic 116. The microprocessor 114 is electrically coupled to the interface logic 112, through which to receive instructions or data (e.g., write instruction, read instruction, erase instruction, etc.) from a host (e.g., electronic device such as computer, mobile phone or digital camera with arithmetic function, not shown). The microprocessor 114 is further electrically coupled to the data storage medium 120 through the control logic 116. The microprocessor 114 is configured to perform data access or data erase on the data storage medium 120 through the control logic 116.

Figure 2:
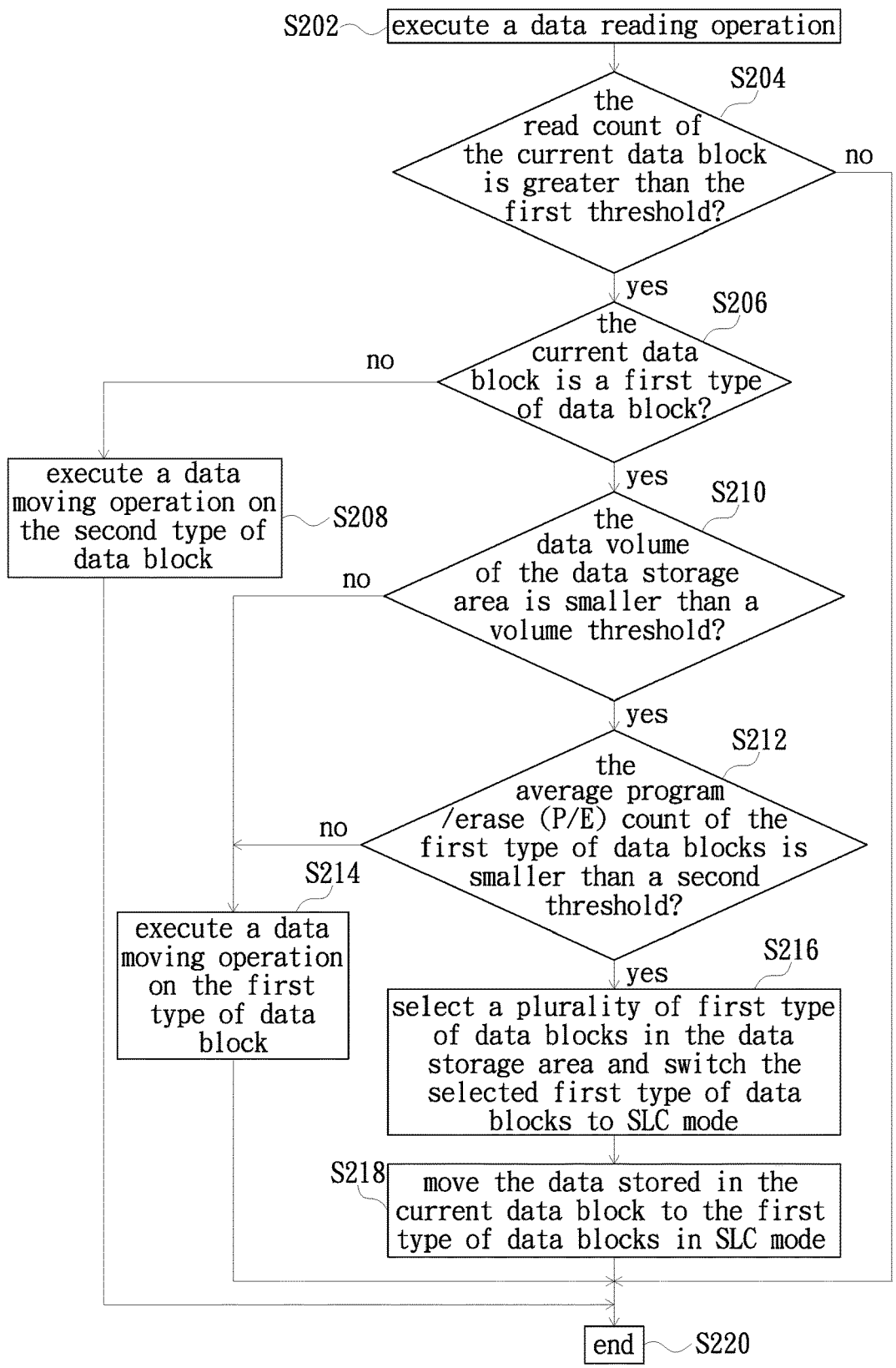
FIG. 2 is a flowchart of a data storing method for a storage device in accordance with an embodiment of the present invention.

FIG. 2 is a flowchart of a data storing method for the storage device 100 of FIG. 1 in accordance with an embodiment of the present invention. Please refer to FIG. 1 and FIG. 2 together. In the present embodiment, when the microprocessor 114 receives a read instruction from the host through the interface logic 112 or the microprocessor 114 itself initiates a data reading operation (e.g., garage collection) so as to execute a data reading operation on a specified data block in the data storage medium 120 through the control logic 116, the microprocessor 114 executes the operating process illustrated in FIG. 2.

As shown in FIG. 2, first, the data reading operation is executed (step S202). Then, the microprocessor 114 determines whether the read count of that specific data block currently being selected during the data reading operation (hereunder the specific data block currently being selected during the data reading operation is referred to as the current data block) is greater than a first threshold (step S204). In the present embodiment, the step S204 is for determining whether the data saved in the current data block is frequently-read data. When the determination result obtained in step S204 is No, the microprocessor 114 then directly ends the procedure (step S220). Alternatively, when the determination result obtained in step S204 is yes, the microprocessor 114 then determines whether the current data block is a first type of data block (step S206). In the present embodiment, specifically, the step S206 is for determining whether the current data block is a TLC data block.

When the determination resulted obtained in the step S206 is No, the microprocessor 114 then executes a data moving operation on the second type of data block 142 (step S208). In the present embodiment, specifically, the step S206 is for moving the data stored in the current data block (a second type of data block 142) to another second type of data block 142 or a first type of data block 132. Then, the microprocessor 114 ends the procedure (step S220). Alternatively, when the determination resulted obtained in step S206 is yes, the microprocessor 114 then determines whether the data volume of the data storage area 130 is smaller than a volume threshold (step S210) or determines whether the number of the first type of data block 132 not saving valid data in the data storage area 130 is greater than a threshold. In the present embodiment, specifically, the step S210 is for determining whether there is a sufficient number of first type of data block 132 (TLC data block) in the data storage area 130 so that the microprocessor 114 can switch some of the first type of data block 132 (TLC data block) to SLC mode.

In one embodiment, the aforementioned volume threshold in the step S210 is ranged from 5% to 95% of the total data storage capacity of the data storage area 130. In one preferred embodiment, the aforementioned volume threshold in the step S210 is ranged from 50% to 90% of the total data storage capacity of the data storage area 130. If the volume threshold is set to 90% of the total data storage capacity, it is meant that the 90% of the first type of data blocks 132 in the data storage area 130 is used for storing data and the remaining 10% of the first type of data blocks 132 can be switched to SLC mode. In addition, the aforementioned switch to SLC mode can be implemented by a software program; that is, by the software program the storage unit in the TLC data block is limited from storing three bits to one bit.

When the determination result obtained in the step S210 is No, the microprocessor 114 then executes a data moving operation on the first type of data block 132 (step S214). In the present embodiment, specifically, the step S214 is for moving the data stored in the current data block (a first type of data block 132) to another first type of data block 132; that is, the microprocessor 114 moves the data stored in the current data block (a TLC data block) to another TLC data block not saving any valid data. In one embodiment, the microprocessor 114 may perform the garbage collection on the current data block through the control logic 116, so as to reduce the number of the first type of data block 132 saving any valid data in the data storage area 130. Then, the microprocessor 114 ends the procedure (step S220). Alternatively, when the determination result obtained in the step S210 is yes, the microprocessor 114 then determines whether the average program/erase (P/E) count of the first type of data blocks 132 in the data storage area 130 is smaller than a second threshold (step S212). In one embodiment, the data storage capacity of the first type of data blocks 132 will be significantly reduced once the average program/erase count thereof is greater than 2500; therefore, the step S212 in the present embodiment is for determining whether the average program/erase count of the TLC data blocks is less than 2000. It is to be noted that once the first type of data block 132 (a TLC data block, originally) is switched to a SLC mode, the program/erase count thereof may be significantly increased and when it is greater than a certain value, it may cause a short lifespan; therefore, the goal of the step S212 is to avoid the aforementioned situation.

When the determination result obtained in the step S212 is No, the microprocessor 114 then sequentially executes the steps S214 and S220. Alternatively, when the determination result obtained in the step S212 is yes, the microprocessor 114 then selects a plurality of first type of data blocks 132 (TLC data blocks) in the data storage area 130 and switches the selected first type of data blocks 132 to SLC mode (step S216). In the present embodiment, specifically, the microprocessor 114 selects three TLC data blocks in the data storage area 130 and then switches the selected three TLC data blocks to SLC mode.

Then, the microprocessor 114 moves the data stored in the current data block to the first type of data blocks switched to SLC mode through the control logic 116 (step S218). In the present embodiment, specifically, the microprocessor 114 moves the data stored in the current data block to the three TLC data blocks switched to SLC mode. Then, the microprocessor 114 ends the procedure (step S220).

Compared with the native TLC data block, the TLC data block switched to SLC mode has lower data storage capacity but higher data access speed. Therefore, the storage device of the present invention has a higher data access speed for the frequently-read data. Further, it is to be noted that the sequence of the steps in FIG. 2 is for an exemplary purpose only, and the present invention is not limited thereto. For example, the sequence of the steps S210 and S212 may be reversed without affecting any realization of the present invention. Further, the step S210 may be omitted in one embodiment if desiring a higher speed of the execution of the present invention.

In summary, when the data reading operation is executed on the current data block, the control unit of the storage device of the present invention determines whether the read count of the current data block is greater than the first threshold and whether the current data block is the first type of data block. If both of the aforementioned determination results are true, the control unit switches the plurality of first type of data blocks (e.g., TLC data blocks) to the fast mode (e.g., SLC mode) with lower data storage capacity but higher data access speed, and moves the data in the current data block to the switched first type of data blocks. As a result, the storage device of the present invention has a higher data access speed for frequently-used data.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A storage device, comprising:
    a data storage medium, comprising a data storage area and a data buffer area, wherein the data storage area comprises a plurality of first type of data blocks, and the data buffer area comprises a plurality of second type of data blocks; and
    a control unit, electrically coupled to the data storage medium, wherein when a data reading operation is executed on a current data block of the data storage medium, the control unit is configured to determine whether a read count of the current data block is greater than a first threshold, determine whether the current data block is one of the first type of data blocks, and generate a determination result accordingly, wherein according to the determination result, the control unit is further configured to select a portion of the first type of data blocks in the data storage area, switch the selected portion of the first type of data blocks to a first mode, and move data stored in the current data block to the selected portion of the first type of data blocks under the first mode,
    wherein each of the first type of data blocks has a higher storage capacity than each of the selected portion of the first type of data blocks under the first mode;
    wherein when the controls unit determines that the current data block is not one of the first type of data blocks, the controls unit is configured to execute a data moving operation on the second type of data blocks.

2. The storage device according to claim 1, wherein each of the first type of data blocks has a higher data storage capacity than each of the second type of data blocks.

3. The storage device according to claim 1, wherein the determination result is further involved of:
    configuring the control unit to determine whether an average program/erase count of the first type of data blocks is smaller than a second threshold; and
    if no, configuring the control unit to move the data stored in the current data block to one of the first type of data blocks.

4. The storage device according to claim 1, wherein the determination result is further involved of:
    configuring the control unit to determine whether a data volume of the data storage area is smaller than a volume threshold; and
    if no, configuring the control unit to move the data stored in the current data block to one of the first type of data blocks.

5. The storage device according to claim 1, wherein the determination result is further involved of:
    configuring the control unit to determine whether a total number of the unused first type of data blocks is greater than a threshold; and
    if no, configuring the control unit to move the data stored in the current data block to one of the first type of data blocks.

6. A data storing method for a storage device, com rising steps of:
    performing a data reading operation on a current data block;
    determining whether a read count of the current data block is greater than a first threshold;
    determining whether a data volume of a data storage area is smaller than a volume threshold;

if yes, selecting and switching a plurality of first type of data blocks in the data storage area to a fast mode, wherein the data blocks have a lower data storage capacity are configured to operate faster in the fast mode; and moving data stored in the current data block to the selected first type of data blocks in the first mode.

7. The data storing method for a storage device according to claim 6, wherein the fast mode is either a single-level cell (SLC) mode or a multi-level cell (MLC) mode.

8. The data storing method for a storage device according to claim 6, wherein the first type of data blocks are either TLC data blocks or MLC data blocks.

9. The data storing method for a storage device according to claim 6, further comprising a step of:

if no, performing a data moving operation on the current data block.

10. The data storing method for a storage device according to claim 6, further comprising a step of:

determining whether an average program/erase count of the first type of data blocks is smaller than a second threshold.

11. The data storing method for a storage device according to claim 6, wherein the first type of data blocks under the fast mode operates as a data buffer of the storage device.

12. The data storing method for a storage device according to claim 6, wherein the storage device further comprises a plurality of second type of data blocks.

13. A method of data management, comprising:

defining a data storage area and a data buffer area, wherein the data storage area comprises a plurality of first type of data blocks;

performing a data reading operation on a current data block, wherein the current data block is one of the first type of data blocks;

determining whether a read count of the current data block is greater than a first threshold;

determining whether a total number of the unused first type of data blocks is greater than a threshold;

if yes, selecting and switching a portion of the first type of data blocks to a fast mode, wherein the portion of the first type of data blocks has a lower data storage capacity under the fast mode than the portion of the first type of data blocks not under the fast mode; and moving data stored in the current data block to the selected first type of data blocks in the fast mode.

14. The method of data management according to claim 13, wherein the fast mode is either a single-level cell (SLC) mode or a multi-level cell (MLC) mode.

15. The method of data management according to claim 13, wherein the first type of data blocks are either TLC data blocks or MLC data blocks.

16. The method of data management according, to claim 13, wherein the data buffer area comprises a plurality of second type of data blocks.

17. The method of data management according to claim 13, wherein the data buffer area comprises a plurality of first type of data blocks in fast mode.

* * * * *